United States Patent [19]

Calviello, Joseph A.

[11] Patent Number: 4,833,095

[45] Date of Patent: May 23, 1989

[54] METHOD FOR BURIED CHANNEL FIELD EFFECT TRANSISTOR FOR MICROWAVE AND MILLIMETER FREQUENCIES UTILIZING ION IMPLANTATION

[75] Inventor: Calviello, Joseph A., Kings Park, N.Y.

[73] Assignee: Eaton Corporation, Cleveland, Ohio

[21] Appl. No.: 128,882

[22] Filed: Dec. 4, 1987

Related U.S. Application Data

[60] Division of Ser. No. 817,916, Jan. 10, 1986, Pat. No. 4,724,220, which is a division of Ser. No. 702,482, Feb. 19, 1985, Pat. No. 4,601,096, which is a division of Ser. No. 466,662, Feb. 15, 1983, abandoned, which is a continuation of Ser. No. 755,534, Jul. 15, 1985, Pat. No. 4,624,004.

[51] Int. Cl.[4] ............... H01L 21/265; H01L 21/302
[52] U.S. Cl. ............... 437/22; 148/DIG. 53; 148/DIG. 82; 148/DIG. 88; 148/DIG. 122; 357/15; 357/22; 437/40; 437/97; 437/176; 437/192; 437/203; 437/249; 437/911
[58] Field of Search ............... 437/22, 40, 97, 176, 437/192, 203, 249, 911; 148/DIG. 53, DIG. 82, DIG. 88, DIG. 122; 357/15, 22

[56] References Cited

U.S. PATENT DOCUMENTS

| | | | |
|---|---|---|---|
| 3,609,477 | 0/1971 | Drangeid et al. | 357/22 |
| 3,663,873 | 0/1972 | Yagi | 148/175 |
| 3,681,668 | 0/1972 | Kobayashi | 148/175 |
| 3,804,681 | 0/1974 | Drangeid et al. | 148/DIG. 53 |
| 3,912,546 | 0/1975 | Hunsperger et al. | 148/1.5 |
| 3,928,092 | 0/1975 | Bailamy et al. | 148/174 |
| 3,931,633 | 0/1976 | Shannon et al. | 357/22 |
| 4,101,922 | 0/1978 | Tihanyi et al. | 357/22 |
| 4,111,725 | 0/1978 | Cho et al. | 29/571 |
| 4,141,021 | 0/1979 | Decker | 357/22 |
| 4,156,879 | 0/1979 | Lee | 357/22 |
| 4,236,166 | 0/1980 | Cho et al. | 357/22 |
| 4,244,097 | 0/1981 | Cleary | 357/22 |
| 4,249,190 | 0/1981 | Cho | 357/22 |
| 4,265,934 | 0/1981 | Ladd | 29/571 |
| 4,266,233 | 0/1981 | Bertiotti | 357/22 |
| 4,404,732 | 0/1983 | Andrade | 437/22 |
| 4,426,767 | 0/1984 | Swanson et al. | 29/580 |
| 4,551,904 | 0/1985 | Berenz et al. | 29/571 |

FOREIGN PATENT DOCUMENTS

| | | | |
|---|---|---|---|
| 2321895 | of 1974 | Fed. Rep. of Germany | 357/22 |
| 57-37880 | of 1982 | Japan . | |
| 1186945 | of 1970 | United Kingdom | 357/15 |

OTHER PUBLICATIONS

"Integration Technique for Closed Field Effect Transistors", Cady, Jr., et al, IBM Tech. Discl. Bulletin, vol. 16; No. 11, Apr. 1974, pp. 3519–3520.

"The Opposed Gate-Source Transistor (OGST): A New Millimeter Wave Transistor Structure", John J. Berenz, G. C. Dalman and C. A. Lee, TRW Defense and Space Systems Group, Redondo Beach, CA 90278 and Cornell University, School of Electrical Engineering, Ithaca, NY 14853.

Primary Examiner—William G. Saba
Attorney, Agent, or Firm—Andrus, Sceales, Starke & Sawall

[57] ABSTRACT

The fabrication of high performance and reliable Buried Channel Field Effect Transistor (BCFET) using Schottky gate junction and heavily doped N layers for the source and drain electrode is described. The BCFET is composed of a semi-insulating substrate in which two N layers for the drain electrodes and one N layer for the source electrode are formed in one of the semi-insulating surface. The N source electrode is centrally located between the two N drain electrodes and all three lie in the same plane. The source and drain electrodes are separated by a thin semi-insulating layer, the length of which can range from 0.5 micron to several micron range, depending on the desired voltage breakdown. A Schottky gate is defined in an active N layer directly above the source N Layer. The ohmic contacts for the source and drain N layers are defined several microns away from the schottky junction, resulting in a considerable improvement in device reliability. Reliability is further enhanced by the fact that the resulting device is buried within the material where it is insulated from the ambient.

1 Claim, 6 Drawing Sheets

METHOD FOR BURIED CHANNEL FIELD EFFECT TRANSISTOR FOR MICROWAVE AND MILLIMETER FREQUENCIES UTILIZING ION IMPLANTATION

This is a divisional of application Ser. No. 817,916, filed Jan. 10, 1986, now U.S. Pat. No. 4,724,220, which is a division of application Ser. No. 702,482, filed Feb. 19, 1985, now U.S. Pat. No. 4,601,096, which is a division of application Ser. No. 466,662, filed Feb. 15, 1983, which was abandoned in favor of File Wrapper Continuation application Ser. No. 755,534, filed July 15, 1985, now U.S. Pat. No. 4,624,004.

FIELD AND BACKGROUND

This invention relates to the fabrication of semiconductor devices and, in particular, to field effect transistors (FET's) intended for operation at microwave and millimeter frequencies.

The electrical performance of a semiconductor device is dependent upon the structural configuration and, in particular, on the ability of the structure to reduce elemental parasitics, such as series resistance, shunt capacitance and series inductance. The reliability of a device is dependent upon the metallurgical techniques used to provide the junction passivation and to produce the ohmic and Schottky contacts.

Although the last decade has seen good progress in the development and fabrication of FET devices that provide excellent performance and reliability, further progress in these areas is a definite requirement, especially for devices intended for applications in the millimeter frequency ranges.

The basic structure of a conventional FET, shown in FIG. 1, is fabricated upon a semi-insulating substrate 101 and an active, epitaxial N-layer 102. Such substrates are typically made of gallium arsenide. FIG. 1 shows the device to further comprise a source 103, a gate 104, a drain 105, a source to gate length (Lsg) 106, a gate length (Lg) 107, a gate to drain length (Lgd) 108, and a depletion layer 109 located beneath the gate. Contacts for the source 103, gate 104 and drain 105 are made to the active N-layer to control the flow of current between the source and drain. The ohmic contacts are made by sinter alloying a metallic film composed of nickel-germanium gold to the active layer. The nickel-germanium gold, referred to herein as simply germanium gold or Ni-GeAu, usually ranges between 500 and 1000 Angstroms in thickness. The germanium gold film is typically composed of 12 percent germanium and 88 percent gold. Using this contact composition, a contact resistivity ranging between 3 and $5 \times 10$ to the -6th power ohm-centimeter has been achieved. In this structure, the input series resistance can be in the 3 to 5 ohms range if the active N-layer's concentration ranges between 1 and $3 \times 10$ to the 17 power per cubic centimeter and the source ohmic contact is positioned within 1 micron of the gate edge.

For this device configuration, the minimum input source series resistance that can be achieved is limited by the finite source-to-gate length (Lsg) of the conducting channel. For some low noise and low power application this channel length has been reduced to 0.5 microns. However, the reliability and yield of these devices is poor since gold and nickel can easily inter-diffuse with GaAs and eventually diffuse into the active conducting channel, resulting in device performance degradation and ultimately catastrophic failure. An additional limitation of this structure is the effective length of the channel under the gate which is much greater than the metallurgical gate length, resulting in greater effective source to gate capacitance and consequently a lower maximum frequency of oscillation. Furthermore, the conducting channel is fully exposed to the ambient and to contaminants that contribute to poor RF performance and reliability.

To improve device reliability, various dielectric layers, such as $SiO_2$ and $Si_3N_4$, have been used to passivate the exposed conducting channel. $SiO_2$ is known to be ineffective as a passivation for sodium ions, the most notably troublesome contaminant. On the other hand, $Si_3N_4$ is an effective passivation only for sodium ions. In order to provide a complete passivation both $SiO_2$ and $Si_3N_4$ must be used.

For conventional FET devices, the use of these dielectrics often increase the parasitic capacitance between the source and gate (Csg), between gate and drain (Cgd), and between source and drain (Csd). These added parasitic capacitances effectively limit the efficient operation of conventional FETs to well below 20 GHz.

To improve FET performance, other configurations, such as those shown in FIGS. 2 and 3, have been developed. As can be seen in these Figures, the improved FET structures are similar to the conventional structure of FIG. 1, with the exception that a first epitaxial N+ layer 201 has been added at the surface of the semi-insulating substrate beneath the source, and a second epitaxial N+ layer 202 has been added beneath the drain. FIG. 3 also differes from FIG. 1 in that the gate is placed in a recess 301 in the N layer.

Unfortunately, the quality of the epitaxial layers in these structures are difficult to evaluate. In addition, the fabrication steps are more complex and result in poor device yield as well as poor characteristic uniformity.

On the other hand, these devices do provide some advantages over the basic FET structure shown in FIG. 1. These advantages include the ability to achieve a lower contact series resistance, lower channel resistance and higher voltage breakdown. The lower contact resistance is achieved by using a highly doped N+ layer with a doping concentration of approximately $2 \times 10$ to the 18th power per cubic centimeter. The lower channel resistance is achieved by using a thicker active N-layer outside the gate region where a recessed gate is employed as shown in FIG. 3. A higher voltage breakdown is achieved by providing a greater separation between the gate and drain. In addition, the N+ layer can be extended close to the gate to further reduce the parasitic series resistance of the source and drain.

Although some relative minor improvements in electrical performance are attained by the structures shown in FIGS. 2 and 3, there is no appreciable improvement in reliability over the basic FET of FIG. 1. These devices are similar to the basic FET structure in that the channel is exposed to the ambient and contaminants, the ohmic contact to the source is still within one micron of the gate, and the effective gate length is greater than the metallurgical length of the gate.

FIG. 4 shows a FET structure which was developed for low power, high speed logic applications. This device is similar to the device of FIG. 1, with the exception that there is a first N+ layer 401 under the source and a second N+ layer 402 under the drain. The N+ layers 401 and 402 differ from the N+ layers 201 and 202, shown in FIGS. 2 and 3, in that layers 401 and 402 extend up to the gate region rather than remaining confined to the areas immediately below the source and drain, and layers 401 and 402 occupy the area which is occupied by the N layer in FIGS. 2 and 3, except for one small segment which lies directly below the gate.

For low power, high speed logic devices, the required voltage breakdown at 10 uA is typically in the 3 to 5 voltage range. This structure makes use of ion implantation to implant the N+ layer into a semi-insulating substrate. To achieve a very low series resistance, the gate is formed prior to the ion implantation and acts as a mask during this process. Through the use of this technique, the edge of the N+ layers (source and drain) are colinear with the edge of the gate and thereby providing the desired lower series resistance. Ohmic contact of Ni-GeAu are then formed on the implanted N+ layers. Although the series resistance of this device is drastically reduced when compared to the devices of FIGS. 1 to 3, the voltage breakdown and the reliability are also reduced. The voltage breakdown that can be achieved depends upon the carrier concentration of the N+ layers and on the separation between the edges of the N+ layers and the gate. If the N+ layers are doped with a concentration of 10 to the 19th power per cubic centimeter, the expected voltage breakdown at 10 uA is well below 1 volt, making this device unreliable and difficult to fabricate. There is an additional factor which detracts from the reliability of this device. Following the ion implantation process, the wafer must be annealed at about 900 C. At this temperature, the gate metal tends to inter-diffuse with the N+ layer, about its edges, to form an ohmic contact or a short circuit.

The structure of FIG. 5, generally referred to as a permeable base transistor (PBT), is a "normally-off" device which was developed to extend the operating frequency range of FET's into the millimeter region. This device comprises an N+ layer 501, an N layer 502, a source 503, a gate 504, a drain 505 and a depletion layer 506. This Figure is a cross sectional view, showing the device to be formed of a series of layers. The arrangement of these layers beginning with the lowest layer is as follows: the source 503, the N+ layer 501, the N layer 502, the gate 504, a continuation of the N layer 502 and the drain 505. The gate is a thin layer which passes through the N layer and is divided into a series of fingers, such as finger 504A. The fingers are separated by a series of depletion layers, such as depletion layer 506.

The carrier doping concentration of this N-layer is about $1 \times 10$ to the 16th power per cubic centimeter in order to fully deplete the region between adjacent gate fingers at zero bias. In particular, the dimension d 507 is made less than the width of the depletion layer at zero volt bias. The thickness of the gate finger Lg 508, which is also the gate length, can be less than 500 Angstroms. Theoretically, for a doping concentration in the N layer of $1 \times 10$ to the 16th power per cubic centimeter, d equal to 1000 Angstroms, a distance from the gate to the drain (×510) of 0.6 um, a distance from the gate to the source (y 509) of 0.4 um and an Lg of 200 Angstroms, the calculated power delay product is nearly $1 \times 10$ to the minus 15th power joules, the maximum unity gain frequency is in excess of 200 GHz, and the minimum frequency of oscillation is nearly 1000 GHz.

The fabrication of this structure is extremely difficult. In particular, it requires the growth of a single crystal epitaxial layer at the edges and over the metal fingers of the gate. To achieve short gate lengths, the gate metal must be made very thin, increasing the gate resistance to an intolerable high value. To achieve a fully depleted layer, the value of the carrier concentration is reduced by an order of magnitude from $1 \times 10$ to the 17th power per cubic centimeter for a conventional FET to to $1 \times 10$ to the 16th power per cubic centimeter, producing an increase in the resistivity of the epilayer.

Although the PBT structure has been fabricated, the experimental results to date have not been encouraging. The best performance obtained with these devices thus far only approaches that achieved with conventional devices at frequencies well below 20 GHz.

The goal in the development of the above conventional and PBT FET structures was to increase the maximum oscillating frequency, lower the noise figures where the application was low noise amplifiers, increase the output power where the application was power amplifiers, and increase the switching speed where the application was gigabit logic circuitry. At the present time, the predicted maximum frequency of oscillation for conventional devices is 120 to 140 GHz. This limitation is attributed to the finite parasitic series resistance of the N-layer beneath the source, and the length of the depletion layer beneath the gate, which is larger than the physical length of the gate material. This makes the effective gate capacitance greater than that calculated from the physical dimensions of the gate and accordingly limits the operation of the device to lower frequencies.

The cross-section of a conventional FET device and its equivalent electrical circuits are shown in FIGS. 6A and 6B, respectively. This device comprises a semi-insulating layer 101, an N layer 102, a source 103, a gate 104 and a drain 105. The corresponding equivalent circuit comprises a gate resistance Rg 601, a source resistance Rs 602, an intrinsic channel resistance Ri 603, a drain to source resistance Rds 604, a drain resistance Rd 605, a source to gate capacitance Csg 606, a gate to drain capacitance Cgd 607, a source to drain capacitance Csd 608, and a current generator eg-gm 609, which produces a current equal to the gate voltage (eg) multiplied by the transconductance (gm). For this circuit, the maximum frequency of oscillation fm is given by:

$$f_m = \frac{f_T}{2(\tau_1 + \tau_3 f_T)} l_2$$

where the frequency at unity gain $f_T$ is given by $$f_T = \frac{1}{2\pi} \frac{g_m}{C_{gs}},$$

and gm is the transconductance $$\tau_1 = \frac{Rg + Ri + Rs}{R_{ds}}$$

and $$\tau_3 = 2\pi Rg \, C_{dg}$$

As indicated in the above equations, to achieve a high maximum frequency of oscillation, it is necessary to maximize $f_T$. This is realized by decreasing the gate to source capacitance (Cgs), the gate to drain capacitance (Cgd), the parasitic source resistance (Rs), the gate resistance (Rg), the intrinsic channel resistance (Ri) and by increasing the transconductance (gm).

The value of Rs generally cannot be reduced below 1 ohm when using conventional FET structures designed for use in low noise or power application. Rs and Ri can be somewhat reduced by increasing the carrier concentration in the active N-layer, however, this results in the gate to drain voltage breakdown also being reduced.

SUMMARY

It is an object of the present invention to provide a field effect transistor which overcomes the fabrication and yield difficulties encountered with conventional and PBT structures.

It is an object of the present invention to provide a high performance and highly reliable field effect transistor capable of operating in the millimeter frequency range.

It is an object of the present invention to provide a field effect transistor structure capable of modification to provide devices for low noise amplifier, power amplifier and high speed logic applications.

It is an object of the present invention to provide a field effect transistor which exhibits extremely low parasitic input series resistance, reduced skin effect losses, twice the normal transconductance, reduced effective gate length, a protected buried channel, and diffusion barriers for the source and drain.

In the present invention, the source series resistance is essentially eliminated by placing the source contact electrode directly below the Schottky gate. The source electrode is centered between two drain electrodes, which all lie in the same plane and in the same semi-insulating layer. An epitaxial N-layer, covering the source and drains, supports on its upper surface the gate electrode. The source and drains are separated by a thin semi-insulating layer, the thickness of which is adjusted to be 1 micron or less for low noise devices and several microns for high power devices.

The source and drain electrodes are composed of very highly doped layers with doping concentrations ranging between $5 \times 10$ to the 18th power to $5 \times 10$ to the 19th power per cubic centimeter. Using these very highly doped layers and refractory metals contacts with gold overlayer, it is possible to achieve very low resistivity ohmic contact to the source and drain that may be located only several microns away from the junction. The high doping concentrations make possible low resistance ohmic contacts despite the use of refractory metals, while the refractory metals function as diffusion shields, permitting the use of gold overlayers close to the junction without device degradation due to gold interdiffusion. The result of this arrangement is improved reliability provided by the diffusion shields and improved RF performance provided by the reduction in resistance.

By making the length of the source electrode less than or equal to the metallurgical gate length and by placing the source N+ electrode directly below the gate, the resulting effective gate length is considerably less than that of conventional FETs. This feature combined with the extremely low source series resistance result in an electron velocity overshoot of $4 \times 10$ to the 7th power volts per centimeter instead of $1 \times 10$ to the 7th power volts per centimeter, increasing the maximum frequency of oscillation well above 350 GHz.

Since the conducting channel lies within the semiconductor active N layer and below a thin semi-insulating layer, it is protected from ambient and contamination. In addition, the leakage current, between the source and gate and between gate and drain, is drastically reduced.

The device structure is essentially planar and therefore it is applicable to monolithic integrated circuits. The use of thick (equal to or greater than 1 um) and heavily doped layers (1 to $5 \times 10$ to the 19th power per cubic centimeter) reduces the losses due to skin effect permitting high performance in the microwave to millimeter wavelength region.

DETAILED DESCRIPTION OF THE INVENTION

Figure 7A:
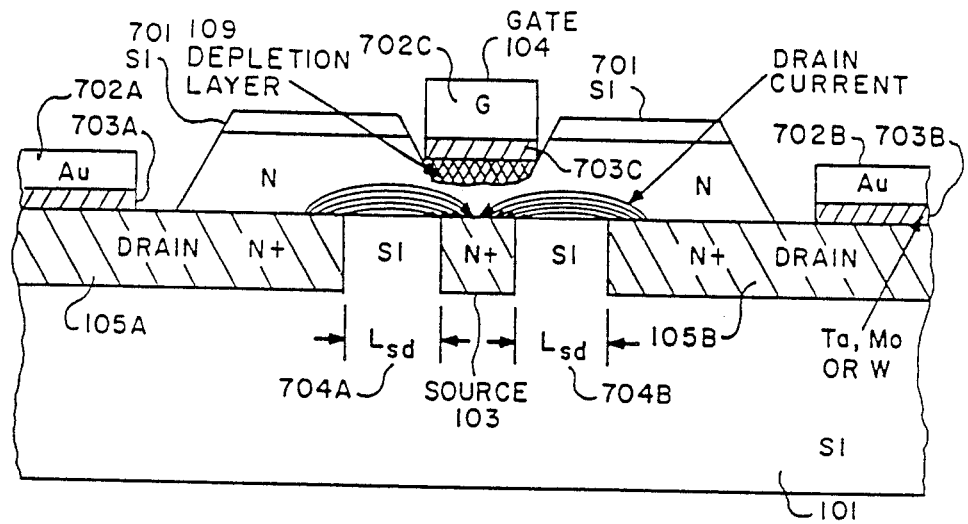
FIG. 7A is a cross sectional view of a field transistor incorporating the present invention.
Figure 7B:
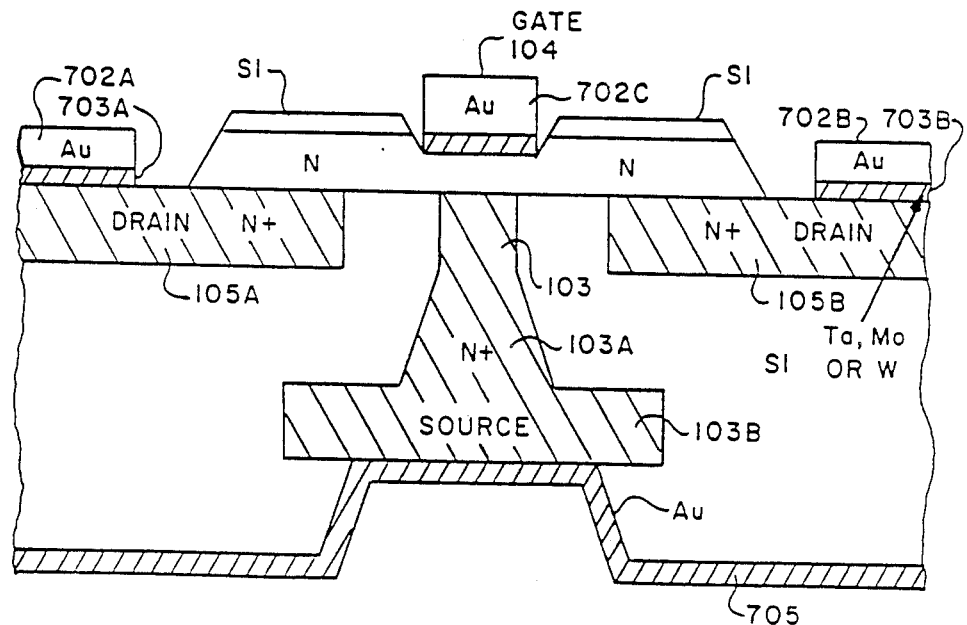
FIG. 7B is a cross sectional view of a field transistor similar to that shown in FIG. 7A with a connection made to the source contact by way of a conductive path produced through the substrate.

The present invention is a buried channel field effect transistor (BCFET). The cross-sections of two BCFET are shown in FIGS. 7A and 7B. The intrinsic and extrinsic elemental values associated with these configurations are shown in FIG. 8A and the electrical equivalent circuit is shown in FIG. 8B.

FIG. 7A comprises a semi-insulating substrate 101, and an N+ layer located on top of the semi-insulating substrate which is divided by semi-insulating segments into a first drain 105A to the left, a centrally located source 103, and a second drain 105B to the right. The first and second drain contacts are formed of a thin layer of a refractory metal 703A and 703B respectively and an overlay of gold 702A and 702B respectively. An N layer 102 covers the source and drains and supports on its upper surface a centrally located and recessed gate 104 which is surrounded by a semi-insulating layer 701. The gate 104 is formed of a thin refractory metal layer 703C and an overlayer of gold 702C. The refractory metal layer 703C makes contact with the N layer and is located directly above the depletion layer 109.

FIG. 7B is similar to FIG. 7A with the exception that connection to the source is made through the lower portion of the substrate by way of N+ doped areas 103A and 103B which pass through the center of the substrate and connect to a gold underlayer located on the lower side of the substrate.

Figure 1:
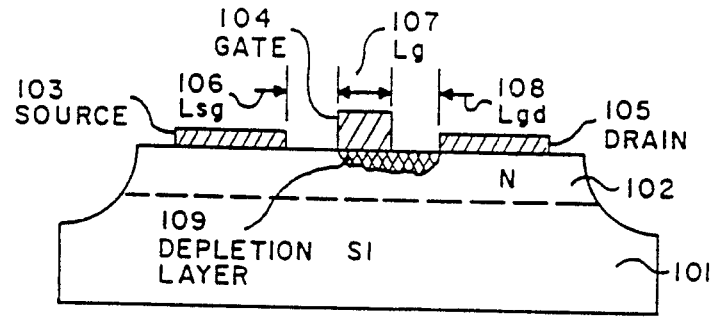
FIG. 1 is a cross sectional view of a basic field effect transistor.
Figure 2:
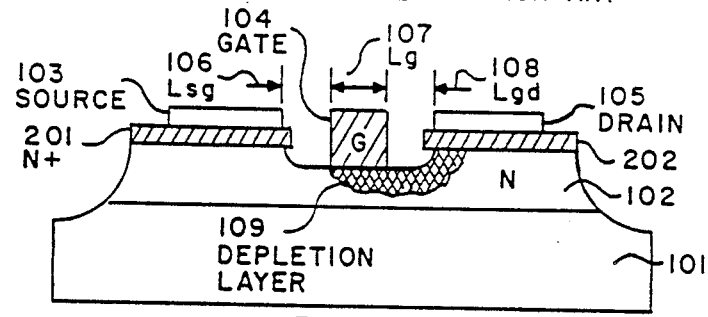
FIG. 2 is a cross sectional view of a field effect transistor incorporating an improvement over the basic device of FIG. 1.
Figure 3:
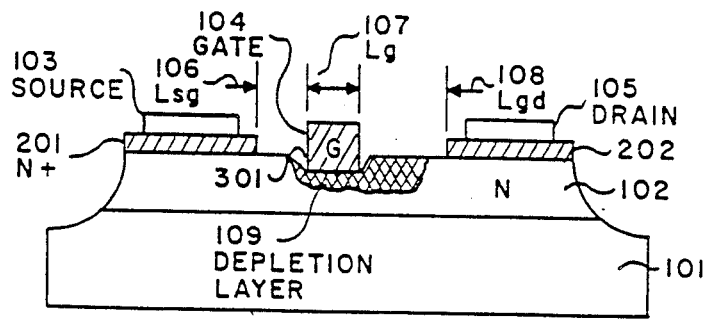
FIG. 3 is a cross sectional view of a field effect transistor incorporating additional improvements over the basic device of FIG. 1.
Figure 4:
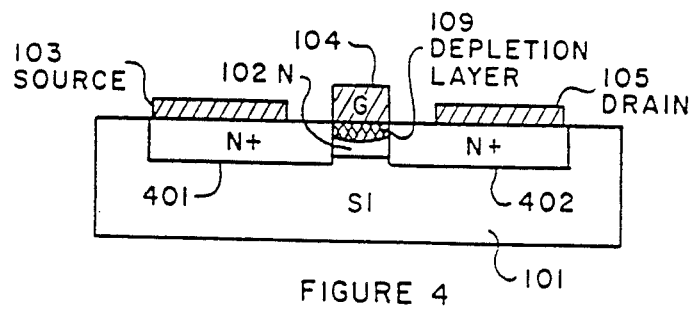
FIG. 4 is a cross sectional view of a field effect transistor developed for low power, high speed logic applications.
Figure 5:
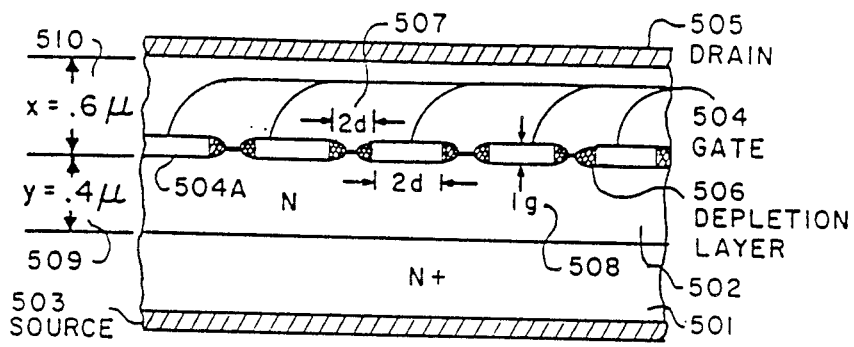
FIG. 5 is a cross sectional view of a permeable base transistor.
Figure 6A:
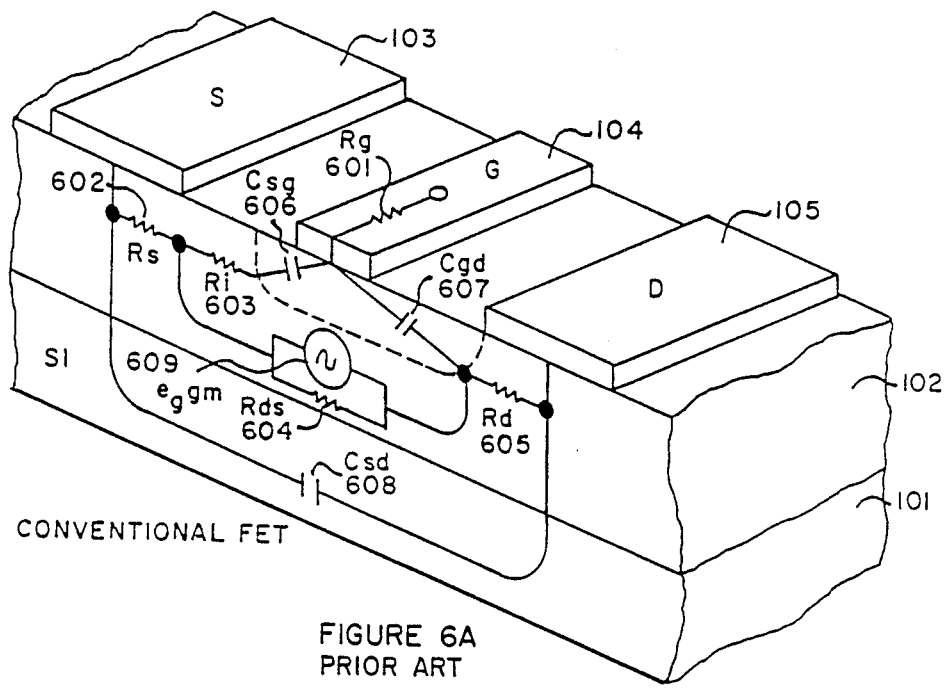
FIG. 6A is a cross sectional view of a field effect transistor which includes an equivalent circuit diagram in which the elements of the equivalent circuit are drawn on the cross sectional view.
Figure 8A:
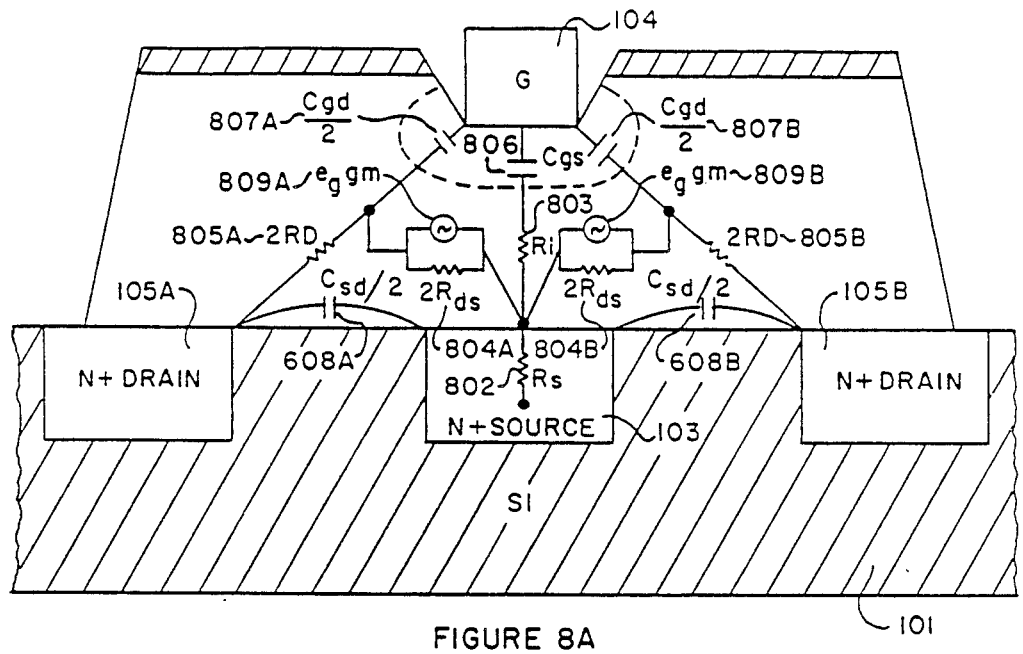
FIG. 8A is a cross sectional view of a field effect transistor incorporating the present invention in which the elements of the present invention are drawn on the cross sectional view.
Figure 8B:
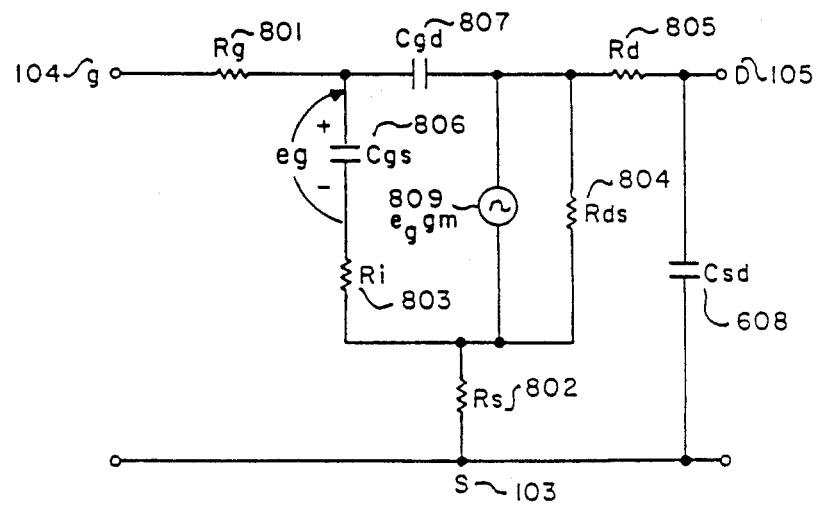
FIG. 8B is the equivalent circuit of FIG. 8A drawn in conventional form.

FIG. 6A and 8A are similar in that a cross sectional view of the devices are shown with the elemental values being drawn on the face of the cross section. However, one primary difference is the device of FIG. 8 has two drains and this necessitates dividing elements Cgd, eggm, Rd, Rs, and Csd into two subelements each, with each having the same drawing numeral, except for the addition of letter A or B to distinguish the two subelements. To simplify nomenclature, the last two digits of the drawing numerals in FIG. 8A and B are the same as those in 6A and 6B for the same elements. However, the first digit of the drawing numerals for these elements in FIG. 8 is an 8.

Figure 6B:
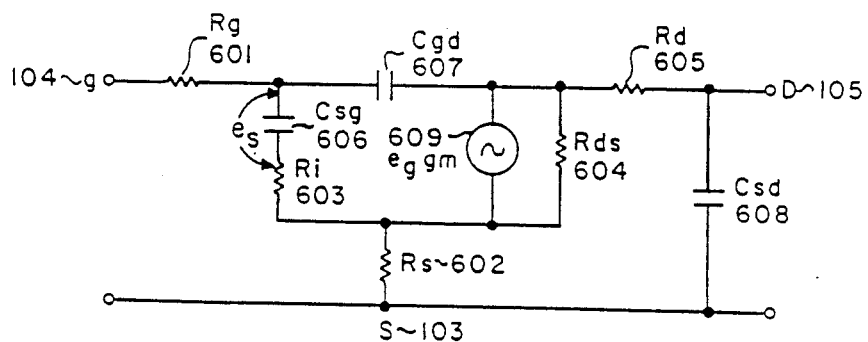
FIG. 6B is the equivalent circuit of FIG. 6A drawn in conventional form.

As can be seen from FIGS. 6B and 8B, the equivalent circuit for the conventional and the BCFET device are the same. However, the values of the intrinsic and extrinsic elements are different. In particular, the magnitude of Rs is drastically reduced. Depending on the device application, Rs may be a factor of 10 lower than that realizable in conventional devices. As can be seen from FIG. 8A, Rs is essentially determined by the bulk resistance of the N+ layer. By keeping the width of the source in the 50-100 um range and its length near 1 um, the value of R can be less than 0.1 ohm, assuming an N+ carrier concentration of $5 \times 10$ to the 19th power per cubic centimeter.

The values of Rd, Ri, Cgs, Rds, Cdg and Csd are also reduced. The magnitude of each depends upon the particular application and frequency of operation. For example, in high speed logic application, where the required voltage breakdown is only in the 3-5 volt range, the source to drain separation can be in the 0.5 to 1 um range and the gate length and width in the 0.2 to 0.5 um and 50 to 100 um range, respectively.

For low noise devices, where the voltage breakdown should be in the 8-15 volts range, the source to drain spacing could be in the 1 to 2 $\mu$m range, the gate width in the 200 to 300 um range, and the gate length near 1 micron, when operating below 20 GHz, and 0.2 to 0.3 when operating in the 30 to 50 GHz and above frequency range.

For high power device application (1 watt or above) where the required voltage breakdown is in excess of 20 volts, the source to drain separation should be greater than 5 microns, the gate width near or above 4 mm and the gate length (which is dependent on the operating frequency) approximately 1.5 micron for 12 GHz and less than 1 micron at 20 GHz and above.

Since the effective gate length is shorter in the BCFET than in conventional devices, the gate length necessary for high RF performance at 12 GHz and above is no longer a stringent requirement. For example, the performance obtained with the BCFETs structure having a 1 um gate length is superior to that of a conventional device having 0.5 um gate length.

By virtue of the BCFET configuration, the leakage current is lower than in conventional devices, and is thus able to achieve bulk breakdown. This feature makes it possible to reduce the source to drain separation and to further reduce the value of Rd.

Independent of its application, however, the BCFET structure, when optimally designed for each intended application, will have elemental values that are considerably less (30-50 percent) than those realizable with conventional FETs.

In addition to the above advantages, it is possible to reduce losses due to skin effect by modifying the BCFET structure. This is achieved by making the thickness of the N+ layer equal to or greater than the skin depth at the operating frequency. For example, for a 50 GHz device, the skin depth in the N+ layer, having a doping concentration of $5 \times 10$ to the 19th power per cubic centimeter, is 3 microns. Usng the BCFET configuration, this layer thickness and concentration can be easily achieved by molecular beam epitaxy technology and still maintain an almost planar device. However, in the conventional FET device, it is not possible to make and N+ layer greater than 0.5 um and still fabricate an FET having a micron or submicron gate length or a channel with a recessed gate.

Another important feature of the BCFET structure is the current flow is contained below the top semi-insulating epitaxial layer (within the N-layer) and near the N/N+SI interface which provides for a self-passivating junction. Furthermore, the complete surface of the active N-layer can in addition be passivated with $SiO_2$ and $Si_3N_4$ and native oxide (gallium oxide) without affecting the inter-electrode capacitances (Csg, Cdg and Csd).

Since heavily doped N+ layers are being used for the source and drain, a low resistivity ohmic contact can be made using a thin layer of a refractory metals such as tantalum, molybdenum or tungsten and a thick overlayer of gold to replace the more familiar Ni-GeAu which require high temperature sinter alloying and can easily give rise to the gold migration failure mechanism. Fortunately, another desirable property derived from the use of the refractory metals as contacts is their operation as excellent gold diffusion barriers.

It is possible to use the same metallurgy for the gate, drain and source contacts, and simultaneously produce these electrodes in a single step, drastically reducing the fabrication process, while greatly improving the device yield.

Since an ohmic contact which incorporates a diffusion barrier is used, the power handling capability and device reliability are greatly improved. An additional improvement in the BCFET device reliability results from the fact that the ohmic contacts to the heavily doped N layers can be defined several microns (10-15 um) from the junction without essentially increasing the value of Rd and Rs.

The BCFET structure reduces the parasitic elemental values and the inter-electrode spacing making it is possible to obtain electron velocity overshoot and thus achieve drift velocities near $4 \times 10$ to the 7th power volts per centimeter as compared to $1 \times 10$ to the 7th power volts per centimeter for conventional devices. This makes possible the fabrication of devices with improved performance capable of operating higher into the millimeter wavelengths than any other known structure.

The mean free electron path lengths between polar optical phonon emission in GaAs range from 0.1 microns at electron energy of 0.05 ev to 0.2 microns at 0.5 ev. The absorption of such phonons has been shown to be only 25 percent of probably emissions at 300 k. The electron path length is decreased by the polar optical phonon energy during collisions. The deflection angle ranges from 5 to 10 degrees from the precollision direction. Thus, to a first order approximation, the electron are ballistic in their motion, which means that the electron velocity is a result of a potential drop within a short distance. To second order approximation, there is a small loss in energy at direction cosine of the velocity. It is well known that in GaAs devices where the dimensions are only a few micron in length there is insufficient ballistic or directed electron motion to be observed in the voltage-current characteristics. However, it is expected that samples less than 1 micron in length will show significant effects, including modest electron velocity overshoot.

In a device having a short length, the electrons would suffer only a slight velocity undershoot below pure ballistic transport motion. It has been shown that in N type GaAs material with a length of approximately 0.5 um, ballistic electrons accelerate to the theoretically predicted velocity determined by the applied potential in a fraction of the device length and then drift at this velocity the rest of the length.

The BCFET is particularly suitable for the fabrication of ballistic transport devices intended for special applications, and in particular for high speed logic devices having source to drain length near or below 0.5 microns. For this application, the structure shown in FIG. 9 is suitable.

Figure 9:
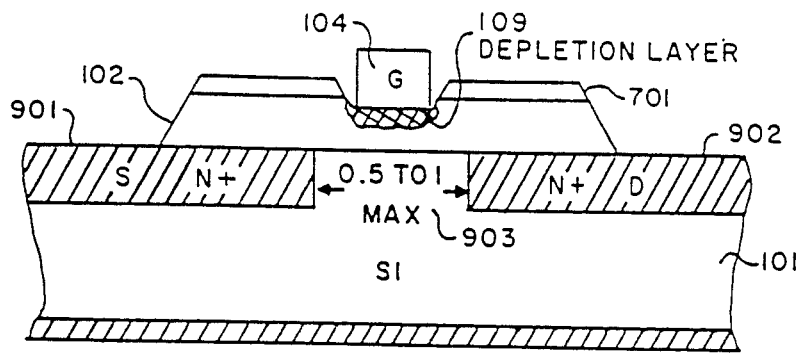
FIG. 9 is a cross sectional view of a buried channel field effect transistor having a single drain.
Figure 10A:
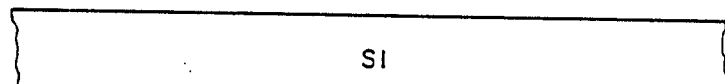
FIG. 10A–E is a series of cross sectional views of the steps in the fabrication process of a first buried channel field effect transistor.
Figure 10B:
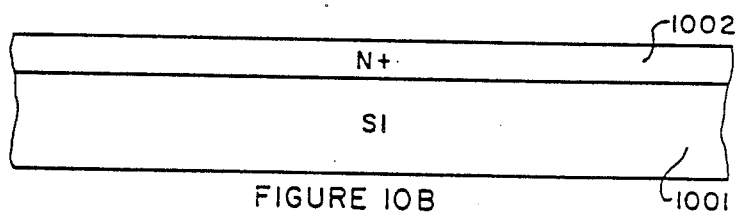
Figure 10C:
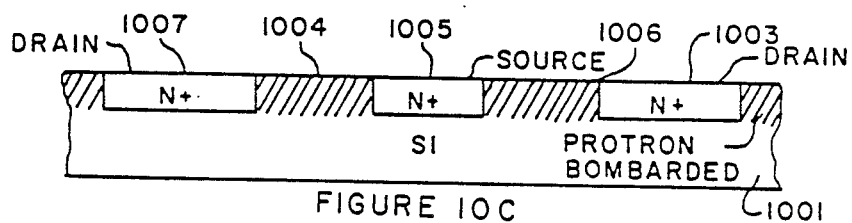
Figure 10D:
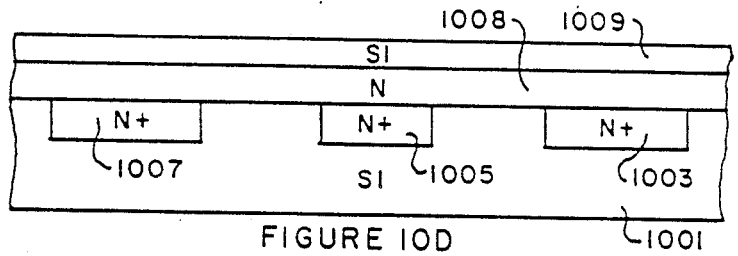
Figure 10E:
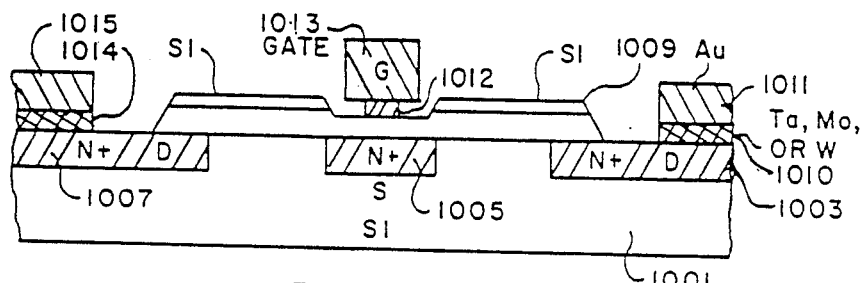
Figure 11A:
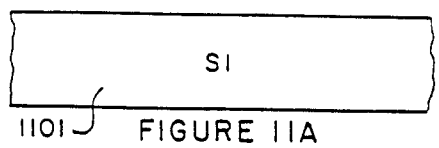
FIG. 11A–H is a series of cross sectional views of the steps in the fabrication process of a second buried channel field effect transistor.
Figure 11B:
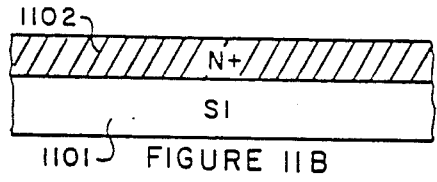
Figure 11C:
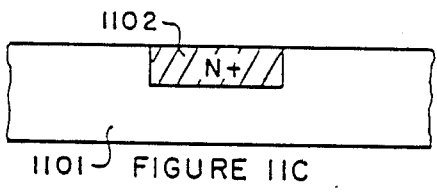
Figure 11D:
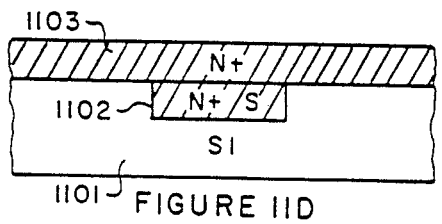
Figure 11E:
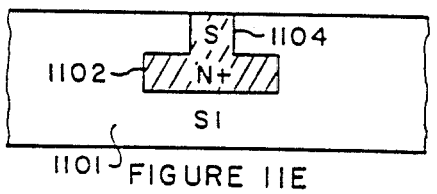
Figure 11F:
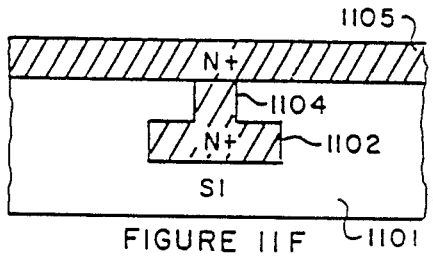
Figure 11G:
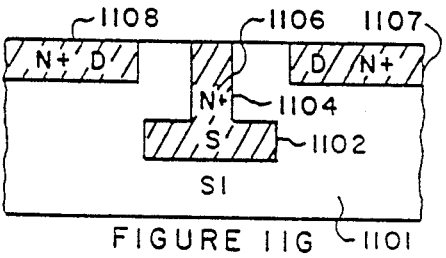
Figure 11H:
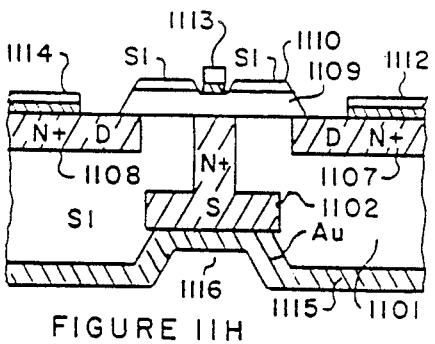

The device of FIG. 9 comprises a semi-insulating substrate 101, and an N+ layer on the upper surface of the substrate divided by a semi-insulating area 903 having a maximum length of 0.5 to 1 um. The left-hand portion of the N+ layer forms the source 901, while the right-hand portion forms the drain 902. On the upper surface of the substrate above the source and drain in an N layer 102. On the upper surface of the N layer is a recessed gate 104 surrounded by a semi-insulating layer 701. This device differs from that shown in FIG. 7 in that there is only one drain and the source is not located directly below the gate; however, the channel remains "buried" and thus protected from the ambient; providing many of the advantages obtained with the device shown in FIG. 7.

The fabrication steps for the BCFETs of FIGS. 7A and 9 are shown in FIGS. 10 and 11 respectively. The fabrication steps in FIG. 10 include providing a semi-insulating layer 1001 shown in FIG. 10A, growing a highly doped N+ layer 1002 on the semi-insulating substrate as shown in FIG. 10B, using the appropriate masks, performing proton bombardment to create semi-insulating layers such as layers 1004 and 1006, which divide the N+ layer into three segments 1003, 1005, and 1007 as shown in FIG. 10C, growing, by epitaxial means for example, an active N layer 1008 on top of the substrate covering the N+ segments and also growing a semi-insulating layer 1009 on top of the active N layer as shown in FIG. 10D, etching the outer edges of the N layer and the semi-insulating layers to form a mesa and exposing the outer portions of N+ layers 1003 which serves as a first drain, and 1007 which serves as a second drain as shown in FIG. 10E, etching away the semi-insulating layer in its central region to expose the N layer, which serves in this exposed area as the gate, masking and depositing a layer of a refractory metal to form contacts 1010, 1012 and 1014, for the first drain, gate and second drain respectively, masking and depositing a layer of gold in the three areas 1011, 1013, and 1015 over the deposited layers of refractory metal to complete the electrical contacts for the first drain, gate and second drain respectively, as shown in FIG. 10E. Using the above steps, the device of FIG. 9 may be fabricated.

Fabrication of the structure FIG. 7B requires additional processing steps which are shown in FIG. 11. The fabrication steps illustrated in FIG. 11 include supplying a semi-insulating substrate 1101 as shown in FIG. 11A, growing, by epitaxial means for example, an N+ layer on the upper surface of the substrate as shown in FIG. 11B, using appropriate masks, performing proton bombardment to reduce the area on the N+ layer to a central region on the upper surface of the substrate as shown in FIG. 11C, growing a second N+ layer 1103 over the upper surface of the substrate as shown in FIG. 11D, performing proton bombardment to reduce the second N+ layer to an even smaller central region 1104 than the first as shown in FIG. 11E, depositing a third N+ layer over the upper surface of the substrate as shown in FIG. 11F, performing proton bombardment to divide the third N+ layer in to a first lefthand area 1108 a central area 1106 and right-hand area 1107, the left-hand area becoming a first drain, the cental area becoming the source and the right-hand area becoming a second drain, growing an active N layer 1109 followed by a thin semi-insulating layer 1110, etching the active N layer and the thin semi-insulating layer to form a mesa, etching through the central area of the thin semi-insulating layer to expose the active N layer, depositing first a layer of refractory metal and then a layer of gold to make contacts 1114, 1112, and 1113 for the first and second source and the gate, respectively, etching the lower surface of the substrate in its central region 1116 to expose the lower portion of the first N+ layer 1102, and depositing a second layer of gold 1115 over the exposed N+ layer 1102 to make contact with the source by way of the succession of N+ layers noted above and as shown in FIG. 11H.

The structure of 7B, which may be produced by the process described in connection with FIG. 11 above, permits a reduction of the interelectrode capacitance between source and drain by making the source electrode length equal to or less than 0.5 um without substantially increasing the source resistance. In addition, by making the base of the source electrode larger (1102 in FIG. 11H), it is possible to achieve the source ground contact (1115) through the substrate, reducing the source inductance and thereby increasing the operating frequency of the BCFET structure into the 100 GHz range.

It should be recognized that there are two methods other than proton bombardment for fabricating the present invention and in particular for fabricating the device illustrated in FIG. 9. The first of these is ion implantation which, as is known to those skilled in the art, produces an N+ layer whithout damage to the structure. The second is molecular beam epitaxy which is essentially a deposition process that also avoids damaging the structure during fabrication. In the ion implantation process a mask somewhat similar to that used in proton bombardment is also used, but ion implantation produced an N+ layer so that areas on which an N+ layer is desired are left exposed, rather than protected as was the case in proton bombardment.

Since ion implantation tends to reduce the effects of doping, very heavily doped layers may be used in the initial processing steps. These layers, as noted above, may have a doping concentration up to about $5 \times 10$ to the 19th power per cubic centimeter. Some in the art would designate this N++.

In molecular beam epitaxy, an amorphous layer is deposted over the surface of the crystal. This amorphous layer may be gallium oxide or silicon dioxide, for example. The use of silicon dioxide in the following claims is therefore representative of all such equivalents and is to be read as such. Windows are then etched through the amorphous layer and deposition is then made by means of molecular beam epitaxy. Where the windows expose the crystal substrate, an N+ layer is formed. Where deposition is made over an amorphous areas, a semi-insulating layer is formed. Since molecular beam epitaxy permits the production of N+ or semi-insulating areas selectively, it is possible to fabricate the present invention and in particular, the structure of FIG. 9 through the use of this process.

Having described my invention, I claim:

1. A process for fabricating a field effect transistor, comprising the steps of:
   (a) supplying a semi-insulating semiconductor wafer having an upper and lower surface and regions located on the upper surface designated as right-hand, central and left-hand regions,
   (b) producing an N+ layer on the upper surface by masking the upper surface to expose the right-hand, left-hand and central regions to ion implantation to convert these regions to N+ regions, the areas not exposed to the ion implantation, remaining in their semi-insulating state and serving to divide and surround the N+ regions,
   (c) growing an N layer over the upper surface of the device,
   (d) growing a semi-insulating layer over the N layer,
   (e) removing the semi-insulating layer over the central region to expose the N layer which forms the gate of the field effect transistor,
   (f) removing a portion of the semi-insulating layer and N layer over the left and right-hand N regions to expose a portion of the N+ regions, the right and left-hand exposed N+ regions forming the drain of the transistor, and
   (g) making contact with the N+ layer in the central region which forms the source for the field effect transistor.

* * * * *